United States Patent
Hammes et al.

(10) Patent No.: US 7,453,325 B2
(45) Date of Patent: Nov. 18, 2008

(54) SINGLE POINT MODULATOR HAVING A PLL CIRCUIT

(75) Inventors: Markus Hammes, Dinslaken (DE); Giuseppe Li Puma, Bochum (DE); Stefan Van Waasen, Sollentuna (SE)

(73) Assignee: Infineon Technologies AG, Munich (DE)

( * ) Notice: Subject to any disclaimer, the term of this patent is extended or adjusted under 35 U.S.C. 154(b) by 895 days.

(21) Appl. No.: 10/917,101

(22) Filed: Aug. 12, 2004

(65) Prior Publication Data
US 2005/0025276 A1    Feb. 3, 2005

Related U.S. Application Data

(63) Continuation of application No. PCT/DE03/00146, filed on Jan. 20, 2003.

(30) Foreign Application Priority Data
Feb. 12, 2002 (DE) .................. 102 05 680

(51) Int. Cl.
*H03C 3/09* (2006.01)
*H03L 7/18* (2006.01)
(52) U.S. Cl. ......................... 332/127; 331/16
(58) Field of Classification Search ................. 332/127; 331/1 A, 16, 23; 327/156–159; 360/51; 375/303, 306, 308, 376; 455/42, 110, 112, 455/113
See application file for complete search history.

(56) References Cited

U.S. PATENT DOCUMENTS

| 5,629,701 | A | 5/1997 | Ritoniemi et al. ........... 341/143 |
| 5,959,562 | A * | 9/1999 | Wiesbauer .................. 341/143 |
| 5,986,512 | A | 11/1999 | Eriksson ...................... 331/16 |
| 6,236,703 | B1 | 5/2001 | Riley ........................... 377/48 |

FOREIGN PATENT DOCUMENTS

DE    199 29 167 A1   12/2000
EP    0 940 922 A1    3/1998

OTHER PUBLICATIONS

J.C. Candy; "A Use of Double Integration in Sigma Delta Modulation"; IEEE Transactions on Communications, vol. COM-33, No. 3, pp. 249-258, Mar. 1985.
M. Perrott et al.; "A 27-mW CMOS Fractional-N Synthesizer Using Digital compensation for 2.5-Mb/s GFSK Modulation"; IEEE Journal of Solid-State Circuits, vol. 32, Edition 12, pp. 2048-20060, 1997.
U. Tietze et al.; "Halbleiter-Schaltungstechnik"; Springer-Verlag, 11 edition; pp. 1140-1144, 1999.

* cited by examiner

*Primary Examiner*—David Mis
(74) *Attorney, Agent, or Firm*—Dicke, Billig & Czaja, PLLC

(57) ABSTRACT

A single-point modulator (1) has a PLL circuit (2) and a programmable frequency divider (7) whose control connection is connected to a circuit branch for injecting a digital modulation signal (15) which is arranged in the feedback path of the PLL circuit (2). The circuit branch contains a sigma-delta modulator (9) which, in turn, has a digital filter (24) having a transfer function H(z). The noise transfer function NTF(z) of the sigma-delta modulator (9) is given by the function NTF(z)=1−H(z).

14 Claims, 2 Drawing Sheets

SINGLE POINT MODULATOR HAVING A PLL CIRCUIT

CROSS REFERENCE TO RELATED APPLICATION

This application is a continuation of copending International Application No. PCT/DE03/00146 filed Jan. 20, 2003 which designates the United States, and claims priority to German application no. 102 05 680.3 filed Feb. 12, 2002.

TECHNICAL FIELD OF THE INVENTION

The invention relates to a single-point modulator for phase or frequency modulation having a PLL circuit for injecting digital modulation data.

BACKGROUND OF THE INVENTION

A low-complexity implementation of a transmitter concept for transceivers in mobile radio systems is provided by transmitters having a modulator which operates on the known principle of single-point modulation. A PLL (phase locked loop) circuit is employed in this case as a frequency synthesizer and is used for phase or frequency modulation of a radio-frequency signal.

In a single-point modulator, the digital modulation data is usually injected into the feedback path of the PLL circuit. The latter contains a programmable frequency divider which is driven by a digital modulation signal. The digital modulation signal determines that number by whose reciprocal the instantaneous frequency of the input signal for the frequency divider is multiplied.

The bandwidth of the PLL circuit must satisfy two competing conditions. On the one hand, the bandwidth must be as narrow as possible in order to be able to comply with predetermined noise requirements of a spectral transmit mask. On the other hand, transmission of the modulated data requires a wide bandwidth.

The article "A 27-mW CMOS Fractional-N Synthesizer Using Digital Compensation for 2.5-Mb/s GFSK Modulation" by Michael H. Perrott, Theodore L. Tewksbury III and Charles G. Sodini, which appeared in the IEEE Journal of Solid-State Circuits, Volume 32, Issue 12, 1997, pages 2048-2060, discloses a single-point modulator which is used in an attempt to satisfy the abovementioned conditions. In this single-point modulator, the noise requirements mean that the bandwidth of the PLL control loop is designed to be considerably narrower than would actually be required for transmitting the modulated data. In order to compensate for the narrow bandwidth, the digital modulation data is first of all prefiltered by means of a digital filter and is then supplied to a sigma-delta modulator before being fed into the frequency divider in the PLL circuit. The disadvantage of a single-point modulator of this type is the requisite matching accuracy between the digital filter for prefiltering the digital modulation data and the analogue loop filter which is usually provided in a PLL circuit.

Two-point modulation provides another known option for compensating for the reduced bandwidth of a PLL control loop. A two-point modulator is based on a single-point modulator. In addition, in a two-point modulator, an analogue modulation signal is injected into a summation point which is situated in the forward path of the PLL circuit and is preferably connected upstream of the voltage-controlled oscillator. The analogue modulation fed in at the summation point has a high-pass filtering effect on the output of the PLL circuit on account of the closed control loop. In contrast, the programmable frequency divider into which the digital modulation signal is fed represents a point in the PLL circuit at which a low-pass transmission response for injecting modulation results. The digital and analogue modulation signals are superimposed at the output of the PLL circuit, thus resulting in the PLL circuit having a frequency-independent transmission response. A two-point modulator of this type is described, for example, in German laid-open specification DE 199 29 167 A1. The disadvantage of a two-point modulator is that its circuitry is more complex than that of a single-point modulator.

SUMMARY OF THE INVENTION

The object of the invention is therefore to provide a single-point modulator which has a PLL circuit and, despite a wide bandwidth of the PLL circuit, can be used to comply with predetermined noise requirements of a spectral transmit mask.

The objective on which the invention is based can be achieved by a single-point modulator for phase or frequency modulation comprising a PLL circuit whose feedback path contains a programmable frequency divider whose control connection is connected to a circuit branch for injecting a digital modulation signal into the PLL circuit, wherein the circuit branch contains a sigma-delta modulator, the sigma-delta modulator has a digital filter having a transfer function $H(z)$, and the noise transfer function $NTF(z)$ of the sigma-delta modulator in the frequency domain is given by a function $NTF(z)=1-H(z)$.

The object can also be achieved by a method for phase or frequency modulation comprising the steps of providing a PLL circuit whose feedback path contains a programmable frequency divider whose control connection is connected to a circuit branch for injecting a digital modulation signal into the PLL circuit, providing a sigma-delta modulator within the circuit branch, wherein the sigma-delta modulator has a digital filter having a transfer function $H(z)$, and wherein the noise transfer function $NTF(z)$ of the sigma-delta modulator in the frequency domain is given by a function $NTF(z)=1-H(z)$.

The digital filter can be arranged in the feedback path of the sigma-delta modulator. It can be possible to program the filter coefficients of the digital filter. The digital filter may be an FIR filter. The sigma-delta modulator may have a MASH structure. The PLL circuit can comprise a voltage-controlled oscillator for providing a phase-modulated or frequency-modulated output signal at its output, a phase frequency detector for determining the phase difference between a feedback signal and a reference signal and for driving the voltage-controlled oscillator as a function of the phase difference determined, and the feedback path for providing the feedback signal. The feedback signal can be derived from the output signal. A Gaussian filter can be connected upstream of the sigma-delta modulator.

The single-point modulator according to the invention for phase or frequency modulation is based on the single-point modulator described in the article (cited above) by Michael H. Perrott, Theodore L. Tewksbury III and Charles G. Sodini. The single-point modulator according to the invention therefore has a PLL circuit whose feedback path contains a programmable frequency divider. The control connection of the programmable frequency divider is connected to a circuit branch serving to inject a digital modulation signal into the PLL circuit. This circuit branch also contains a sigma-delta modulator. A fundamental concept of the invention is that the sigma-delta modulator contains a digital filter having a digital transfer function H(z). Furthermore, the noise transfer function NTF(z) of the sigma-delta modulator in the frequency domain is given by a function NTF(z)=1−H(z).

Section 21.2 of the book "Halbleiter-Schaltungstechnik" [Semiconductor Circuit Technology] by Ulrich Tietze and Christoph Schenk, Springer-Verlag, 1999, 11th Edition, gives a detailed explanation of the mathematical description of digital filters in the frequency domain. This section is included in the disclosure content of the present patent application. This section describes, in particular, the meaning of the variable z in the frequency domain. $z^{-1}$ denotes the z transform of a delay of, for example, one sampling pulse.

The single-point modulator according to the invention makes it possible for the PLL circuit to have the bandwidth required for transmitting the data. In order to nevertheless make it possible to satisfy the noise requirements of a spectral transmit mask, the sigma-delta modulator has a special noise transfer function NTF(z) which is established by suitable selection of the digital filter's transfer function H(z). This results in the quantization noise (which plays a critical role in the noise requirements) of the sigma-delta modulator being appropriately shaped. In this case, the signal transfer function STF(z) of the sigma-delta modulator is unaffected by the selection of the transfer function H(z), and STF(z)=1.

It is furthermore possible to select a high frequency for the reference signal in the single-point modulator according to the invention. This measure reduces the noise floor, so that the quantization noise rises only at relatively high frequencies. According to the invention, this quantization noise is suppressed by the digital filter at relatively high frequencies.

The digital filter is advantageously arranged in the feedback path of the sigma-delta modulator.

In accordance with one particularly advantageous refinement of the invention, it is possible to program the filter coefficients of the digital filter. This measure makes it possible to set and, if appropriate, control or regulate the transfer function H(z) of the digital filter and thus the noise transfer function NTF(z) of the sigma-delta modulator.

In the simplest case, the digital filter may be, for example, an FIR (finite impulse response) filter.

In another advantageous refinement, the sigma-delta modulator has a MASH structure. In the single-point modulator described in the article by Michael H. Perrott, Theodore L. Tewksbury III and Charles G. Sodini, the sigma-delta modulator shown in FIG. 15 likewise has a MASH structure. However, this sigma-delta modulator has a noise transfer function given by the term $[1-z^{-1}]^N$, where N indicates the order of the sigma-delta modulator. The term $z^{-1}$ stems from a delay element arranged in the feedback path of the sigma-delta modulator. The N-tuple zero point at zero frequency means that low frequencies are suppressed in this noise transfer function, whereas high frequency components are transmitted without attenuation. In contrast, instead of the N-tuple zero point at zero frequency, the noise transfer function NTF(z)=1−H(z) according to the invention allows the zero points to be shifted to the adjacent channels. It is therefore possible to comply with predetermined spectral transmit masks as regards the power emitted to the adjacent channels.

The PLL circuit preferably contains a voltage-controlled oscillator which provides a phase-modulated or frequency-modulated output signal at its output, and a phase frequency detector which is used to determine the phase difference between a feedback signal (derived from the output signal) and a reference signal. The voltage-controlled oscillator is driven as a function of the phase difference determined. The PLL circuit also comprises the feedback path which provides the feedback signal.

It is furthermore advantageous, and even necessary for GFSK modulation, for a Gaussian filter to be connected upstream of the sigma-delta modulator.

BRIEF DESCRIPTION OF THE DRAWING

The invention is explained in more detail below with reference to the drawings, in which.

DESCRIPTION OF THE INVENTION

Figure 1:
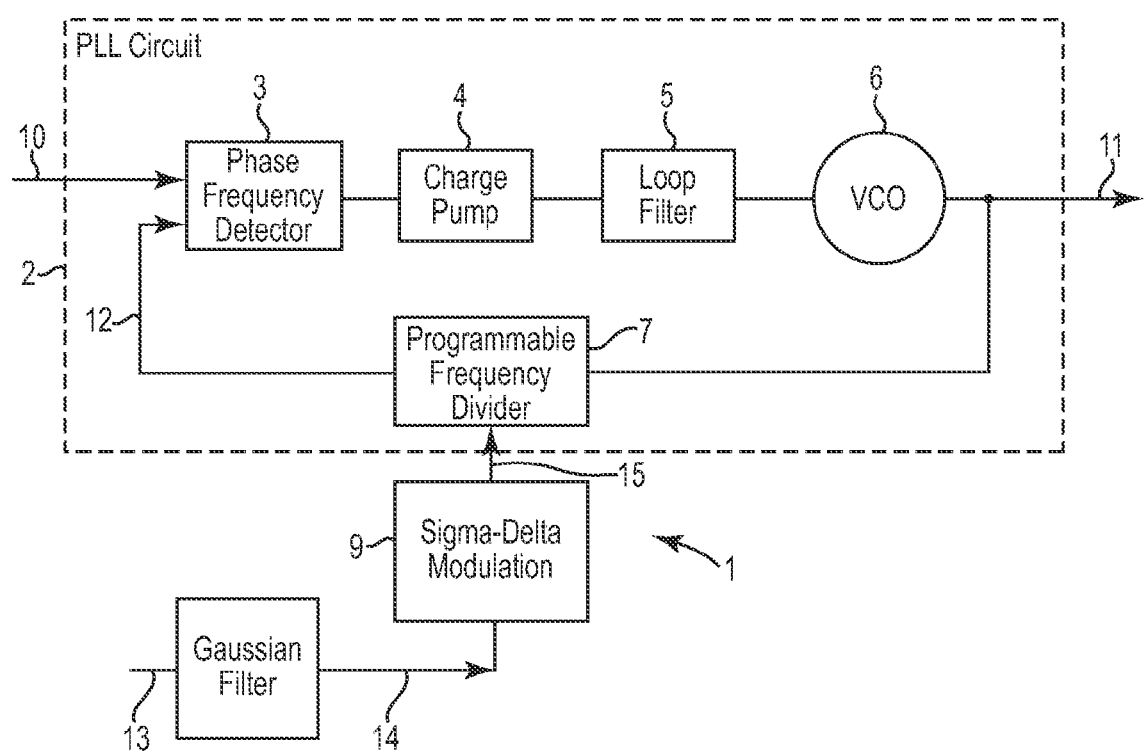
FIG. 1 shows a schematic circuit diagram of one exemplary embodiment of the single-point modulator according to the invention.

FIG. 1 shows a single-point modulator 1 having a PLL circuit 2 which uses an input or reference signal 10 at a reference frequency $f_{ref}$ to produce an output signal 11 at an output frequency $f_{out}$. The output signal 11 can be modulated by digital modulation data 15.

The PLL circuit 2 contains a phase frequency detector 3 whose inputs are supplied with the reference signal 10 and a frequency divider signal 12 which has been fed back. The reference signal 10 is derived, for example, from an oscillating crystal. The phase frequency detector 3 compares the phases of the two signals which are fed to its inputs and produces, at its output, a control signal corresponding to the phase difference between the reference signal 10 and the frequency divider signal 12. The control signal is fed into the input of a charge pump 4 which, as a function of the control signal, generates a current for charging a loop filter 5 connected downstream of the charge pump 4. The loop filter 5 contains an integrating section and a low-pass filter for smoothing the control signal. The signal output by the loop filter 5 is supplied to a voltage-controlled oscillator 6, which represents the oscillation-producing element of the PLL circuit 2 and generates the output signal 11.

The control loop of the PLL circuit 2 is closed by a feedback path which supplies the output signal 11 to an input of the phase frequency detector 3 via a programmable frequency divider 7. The programmable frequency divider 7 is usually in the form of a multi-modulus frequency divider. When the PLL circuit 2 is in the steady state, the output frequency $f_{out}$ of the output signal 11 corresponds exactly to the multiple of the reference frequency $f_{ref}$ determined by the programmable frequency divider 7.

The digital modulation data 15 which is injected into the PLL circuit is obtained from digital modulation data 13. To this end, the digital modulation data 13 is first of all supplied to an optional Gaussian filter 8. Connected downstream of the Gaussian filter 8 is a sigma-delta modulator 9, to which digital modulation data 14 is fed. According to the invention, the sigma-delta modulator 9 contains a digital filter having a transfer function H(z). The noise transfer function NTF(z) of the sigma-delta modulator 9 in the frequency domain is given by the function NTF(z)=1−H(z). The digital modulation data 15 which is fed to the control input of the programmable frequency divider 7 is produced at the output of the sigma-delta modulator 9. The digital modulation data 15 has, for example, a sequence of data words, with each data word representing a number. Upon receipt of each data word via its control input, the programmable frequency divider 7 is programmed in such a manner that it multiplies the frequency $f_{out}$ received from the voltage-controlled oscillator 6 by the reciprocal of the number received.

Figure 2:
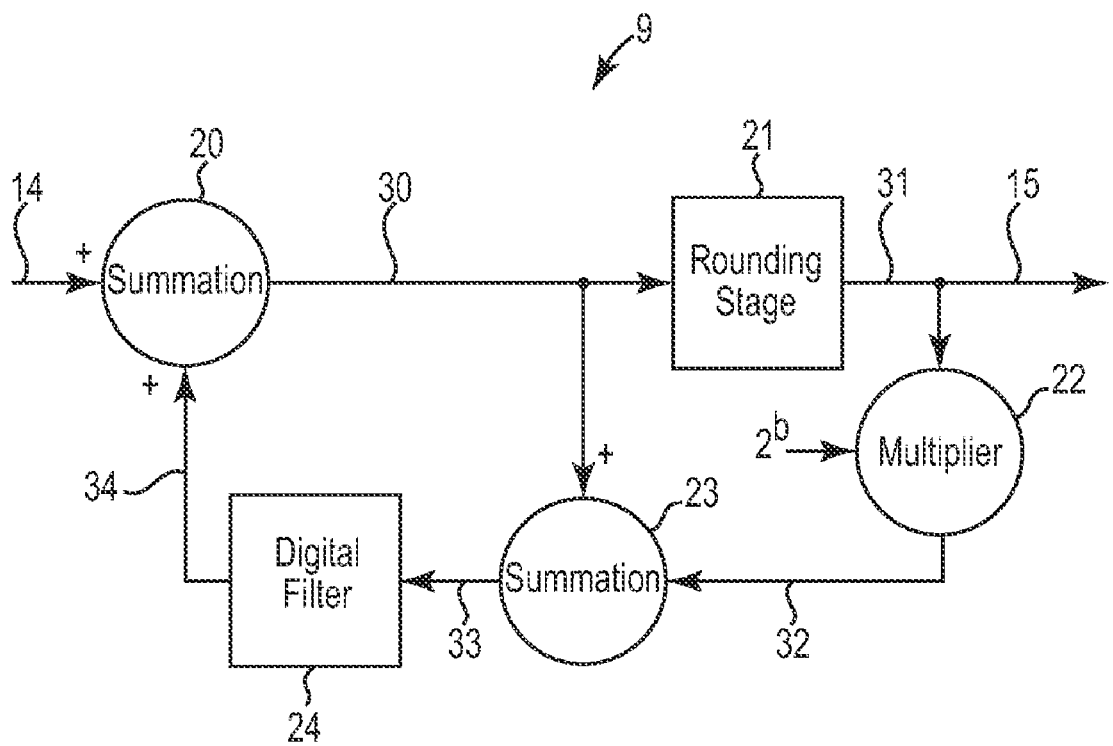
FIG. 2 shows an exemplary embodiment of the architecture of the sigma-delta modulator according to the invention.

FIG. 2 shows an exemplary embodiment of the architecture of the sigma-delta modulator according to the invention. The digital modulation data 14 of word length c enters the sigma-delta modulator 9 shown there, passes through a summation point 20 and is fed, as digital modulation data 30, to a rounding stage 21. The rounding stage 21 shifts the bits of the digital modulation data 30 through b bits to the right, with decimal places being disregarded. As a result, the rounding stage 21 reduces the word length of the digital modulation data 30 from c to c-b (where c>b), that is to say bits 0 to b-1 of the digital modulation data 30 are cut off in the rounding stage 21. The digital modulation data 31 output with a word length of c-b at the output of the rounding stage 21 is multiplied by $2^b$ using a multiplier 22. This results in the bits of the digital modulation data 31 being shifted through b bits to the left. The multiplier 22 therefore produces digital modulation data 32 whose word length is c again. Bits 0 to b-1 of the digital modulation data 32 are each zero, while bits b to c-1 of the digital modulation data 32 correspond to the bits of the digital modulation data 31. The digital modulation data 32 is subtracted from the digital modulation data 30 at a summation point 23. This results in digital feedback data 33 which has a word length b and comprises bits 0 to b-1 of the digital modulation data 30. The digital feedback data 33 is supplied to the input of a digital filter 24 having a transfer function H(z) and programmable filter coefficients. The digital filter 24 provides digital feedback data 34 which is added to the digital modulation data 14 at the summation point 20. The digital modulation data 31 is output, as digital modulation data 15, at the output of the sigma-delta modulator 9.

Figure 3:
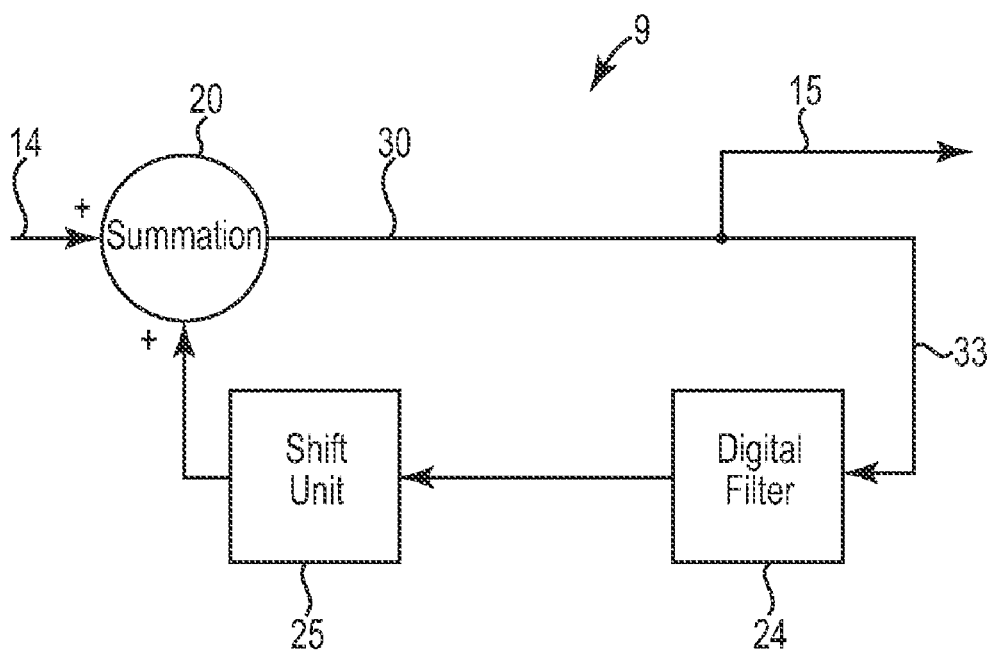
FIG. 3 shows a schematic implementation of the architecture shown in FIG. 2.

FIG. 3 schematically shows one implementation of the architecture shown in FIG. 2. In this case, components and data paths which correspond to the components and data paths shown in FIG. 2 are provided with the same reference symbols as in FIG. 2. In this implementation, the digital filter 24 is an FIR filter with n decimal places. Connected downstream of the digital filter 24 is a unit 25 which shifts the data output by the digital filter 24 through n places to the right and cuts off the decimal places remaining after the shift operation.

We claim:

1. A single-point modulator for phase or frequency modulation comprising a PLL circuit whose feedback path contains a programmable frequency divider whose control connection is connected to a circuit branch for injecting a digital modulation signal into the PLL circuit, wherein
   the circuit branch contains a sigma-delta modulator,
   the sigma-delta modulator has a digital filter having a transfer function H(z), and
   a noise transfer function NTF(z) of the sigma-delta modulator in the frequency domain is given by a function NTF(z)=1−H(z).

2. The single-point modulator according to claim 1, wherein
   the digital filter is arranged in the feedback path of the sigma-delta modulator.

3. The single-point modulator according to claim 1, wherein
   it is possible to program the filter coefficients of the digital filter.

4. The single-point modulator according to claim 1, wherein
   the digital filter is an FIR filter.

5. The single-point modulator according to claim 1, wherein
   the sigma-delta modulator has a MASH structure.

6. The single-point modulator according to claim 1, wherein
   the PLL circuit comprises:
   a voltage-controlled oscillator for providing a phase-modulated or frequency-modulated output signal at its output,
   a phase frequency detector for determining a phase difference between a feedback signal and a reference signal and for driving the voltage-controlled oscillator as a function of the phase difference determined, and
   a feedback path for providing the feedback signal.

7. The single-point modulator according to claim 1, wherein the feedback signal is derived from the output signal.

8. The single-point modulator according to claim 1, wherein
   a Gaussian filter is connected upstream of the sigma-delta modulator.

9. A method for phase or frequency modulation comprising the steps of:
   providing a PLL circuit whose feedback path contains a programmable frequency divider whose control connection is connected to a circuit branch for injecting a digital modulation signal into the PLL circuit,
   providing a sigma-delta modulator within the circuit branch, wherein
   the sigma-delta modulator has a digital filter having a transfer function H(z), and wherein
   a noise transfer function NTF(z) of the signma-delta modulator in the frequency domain is given by a function NTF(z)=1−H(z).

10. The method according to claim 9, further comprising the step of:
    programming the filter coefficients of the digital filter.

11. The method according to claim 9, wherein
    the digital filter is an FIR filter.

12. The method according to claim 9, wherein
    the sigma-delta modulator has a MASH structure.

13. The method according to claim 9, wherein
    the PLL circuit comprises:
    a voltage-controlled oscillator for providing a phase-modulated or frequency-modulated output signal at its output,
    a phase frequency detector for determining a phase difference between a feedback signal and a reference signal and for driving the voltage-controlled oscillator as a function of the phase difference determined, and
    a feedback path for providing the feedback signal.

14. The method according to claim 9, comprising the step of deriving the feedback signal from the output signal.

* * * * *